US010050193B1

(12) United States Patent
Klebanov et al.

(10) Patent No.: US 10,050,193 B1
(45) Date of Patent: Aug. 14, 2018

(54) MAGNETORESISTANCE STRUCTURE PATTERNING

(71) Applicant: Allegro MicroSystems, LLC, Worcester, MA (US)

(72) Inventors: Maxim Klebanov, Newton, MA (US); Paolo Campiglio, Arcueil (FR); Yu-Ming Wang, Zhudong Township (TW)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/613,313

(22) Filed: Jun. 5, 2017

(51) Int. Cl.
*H01L 27/22* (2006.01)
*H01L 43/12* (2006.01)
*H01L 43/08* (2006.01)

(52) U.S. Cl.
CPC ............ *H01L 43/12* (2013.01); *H01L 27/22* (2013.01); *H01L 43/08* (2013.01)

(58) Field of Classification Search
CPC .......... H01L 43/12; H01L 27/22; H01L 43/08
See application file for complete search history.

(56) References Cited

U.S. PATENT DOCUMENTS

| 8,779,764 | B2 | 7/2014 | Meguro et al. |
| 9,007,055 | B2 | 4/2015 | Ono et al. |
| 9,488,702 | B2 | 11/2016 | Meguro et al. |
| 2003/0211424 | A1* | 11/2003 | Werner ................ G11B 5/1272 430/311 |
| 2010/0020592 | A1* | 1/2010 | Hosotani ............... G11C 11/161 365/158 |
| 2010/0327857 | A1 | 12/2010 | Hoshiya et al. |
| 2011/0163739 | A1 | 7/2011 | Ono et al. |
| 2012/0112741 | A1 | 5/2012 | Meguro et al. |
| 2014/0320117 | A1 | 10/2014 | Meguro et al. |
| 2018/0033955 | A1 | 2/2018 | Wong et al. |

FOREIGN PATENT DOCUMENTS

| WO | WO 2010/029684 A1 | 3/2010 |
| WO | WO 2011/007767 A1 | 1/2011 |

OTHER PUBLICATIONS

U.S. Appl. No. 15/219,694, filed Jul. 26, 2016, Wong et al.

\* cited by examiner

*Primary Examiner* — Kyoung Lee
(74) *Attorney, Agent, or Firm* — Daly, Crowley, Mofford & Durkee, LLP

(57) ABSTRACT

In one aspect, a magnetoresistance structure includes a magnetoresistance stack that includes a plurality of layers that includes a first set of one or more magnetoresistance layers and a second set of one or more magnetoresistance layers. The magnetoresistance structure also includes side walls attached to the sides of the first set of one or more magnetoresistance layers and disposed on the second set of one or more magnetoresistance layers.

25 Claims, 5 Drawing Sheets

MAGNETORESISTANCE STRUCTURE PATTERNING

BACKGROUND

A magnetic field sensing element is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. There are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

SUMMARY

In one aspect, a method includes depositing on a substrate a magnetoresistance stack that includes a plurality of layers that includes a first set of one or more magnetoresistance layers and a second set of one or more magnetoresistance layers. The method also includes depositing a hard mask on the magnetoresistance stack; depositing photoresist on the hard mask; patterning the photoresist using photolithography to expose portions of the hard mask; etching the exposed portions of the hard mask to expose a portion of the magnetoresistance stack; stripping the photoresist; etching the first set of one or more magnetoresistance layers of the exposed portion of the magnetoresistance stack to form an intermediate structure comprising the hard mask and the first set of one or more magnetoresi stance layers; depositing an etch barrier on the intermediate structure and the second set of one or more magnetoresistance layers; and etching the etch barrier and a portion of the second set of one or more magnetoresistance layers to the substrate to form a pillar structure that includes side walls that include the etch barrier, the side walls disposed on the second set of one or more magnetoresistance layers.

In another aspect, a magnetoresistance structure includes a magnetoresistance stack that includes a plurality of layers that includes a first set of one or more magnetoresistance layers and a second set of one or more magnetoresistance layers. The magnetoresistance structure also includes side walls attached to the sides of the first set of one or more magnetoresistance layers and disposed on the second set of one or more magnetoresistance layers.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to pattern a magnetoresistance structure. In particular, the magnetoresistance structure is patterned to prevent formation of a conductive layer on the sides of a pillar structure (formed from the magnetoresistance structure) by adding nonconductive sidewalls. A conductive layer on the side of the pillar structure could shunt the pillar structure (e.g., by shunting a tunnel barrier in the pillar structure), which could degrade the sensitivity of a magnetic sensor element that includes a magnetoresistance structure.

Figure 1B:
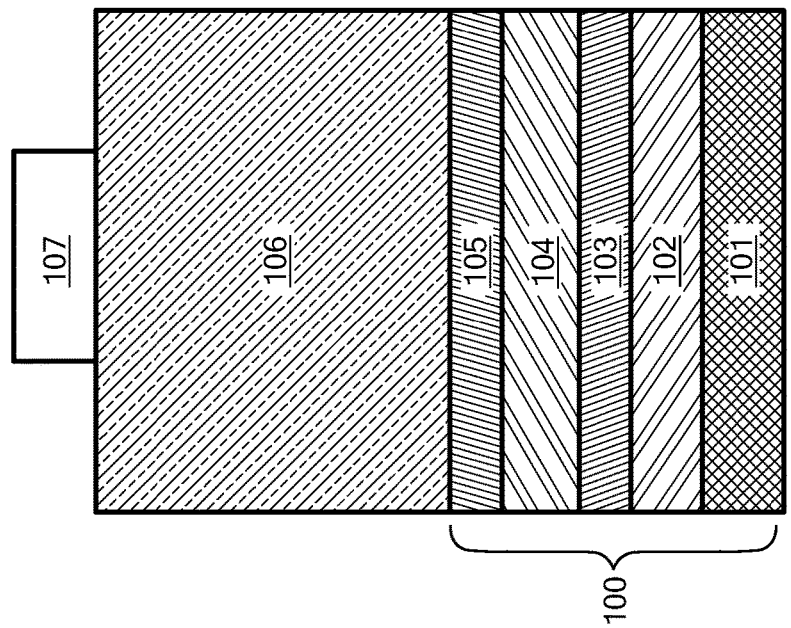
FIGS. 1A to 1H are diagrams of one example to pattern a magnetoresistance stack.
Figure 1A:
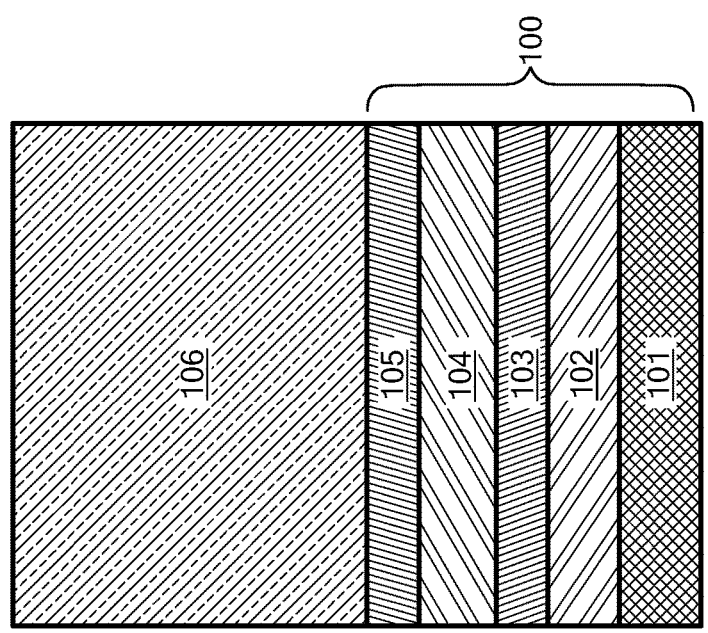

Referring to FIG. 1A, a multi-layer magnetoresistance stack is deposited on a substrate, and a hard mask is deposited on the magnetoresistance stack. For example, a magnetoresistance stack 100 that includes layers, 102, 103, 104, 105 is deposited on a substrate 101 and a hard mask 106 is deposited on the magnetoresistance stack 100. In one example, the magnetoresistance structure may be used in a magnetic field sensing element. In one example, the magnetoresistance stack 100 is a tunneling magnetoresistance (TMR) stack. In another example, the magnetoresistance stack 100 is a magnetic tunnel junction (MTJ) stack.

In some embodiments, the substrate 101 does not have to support electronic circuitry, but may be, for example, a dummy substrate that only supports a magnetoresistive element. In one example, the substrate 101 may include any material suitable for supporting electronic circuitry. In some embodiments, the substrate 101 may include a semiconductor material, including but not limited to silicon, germanium, gallium arsenide, and/or other types of semiconductor materials. In other embodiments, the substrate 101 may include diamond, glass, ceramic, polymer and/or other materials. In one particular example, the substrate 101 is silicon dioxide or silicon nitride. In other examples, the substrate 101 may include both semiconductor and non-semiconductor materials.

In one example, one or more of the layers 102, 103, 104, 105 may include two or more sublayers. In one example, the layers 102, 103, 104 may include active elements. In some examples, the layer 103 is a tunneling barrier, and in one particular example, the tunneling barrier includes magnesium oxide or aluminum oxide.

In some examples, the layer 105 is a capping material that includes, for example, silicon nitride or silicon dioxide. In one example, the hard mask 106 includes silicon dioxide or silicon nitride.

Referring to FIG. 1B, photoresist is deposited on a hard mask and photolithography is used to pattern the photoresist. For example, a photoresist 107 is deposited on the hard mask 106 and photolithography is used to pattern the photoresist 107 to expose portions of the hard mask 106.

Figure 1C:
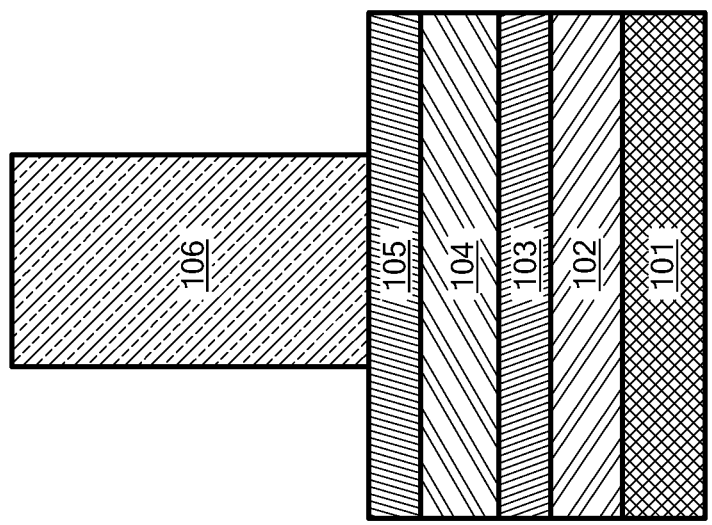
Figure 1D:
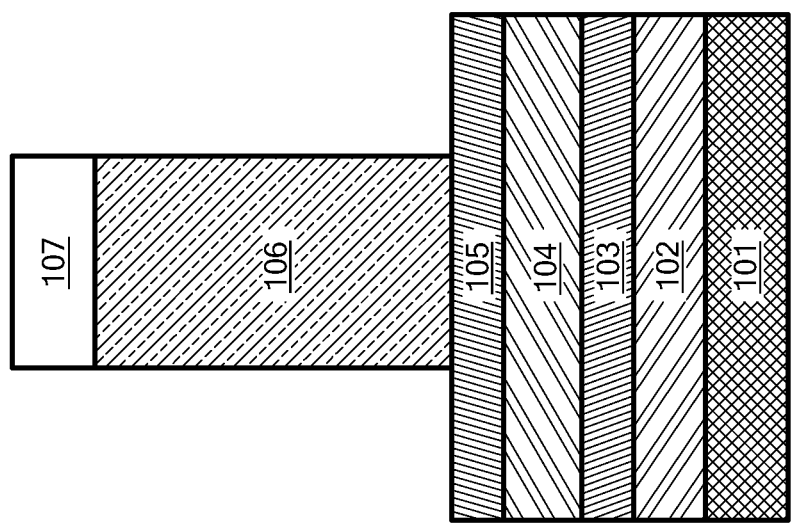

Referring to FIGS. 1C and 1D, an etching process is used to etch the exposed portions of the hard mask, and the photoresist is removed. For example, an etching process (e.g., reactive ion etching) is used to etch the hard mask 106 with the photoresist 107 acting as a mask, and after the etching of the hardmask 106, the photoresist 107 is stripped away.

Figure 1F:
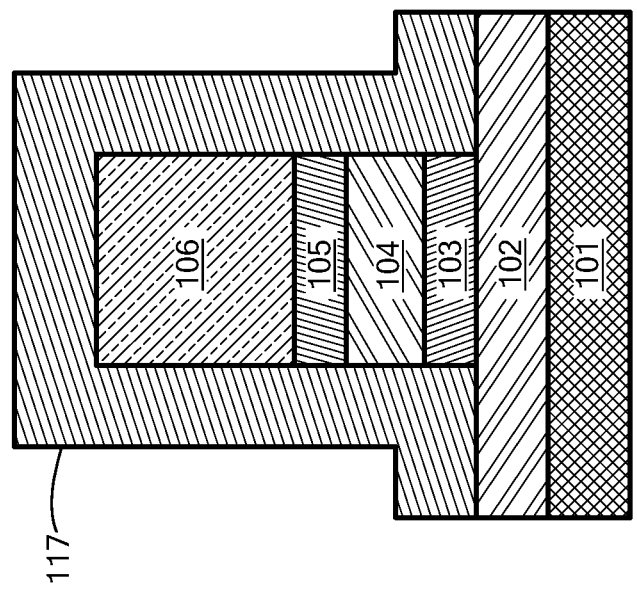
Figure 1E:
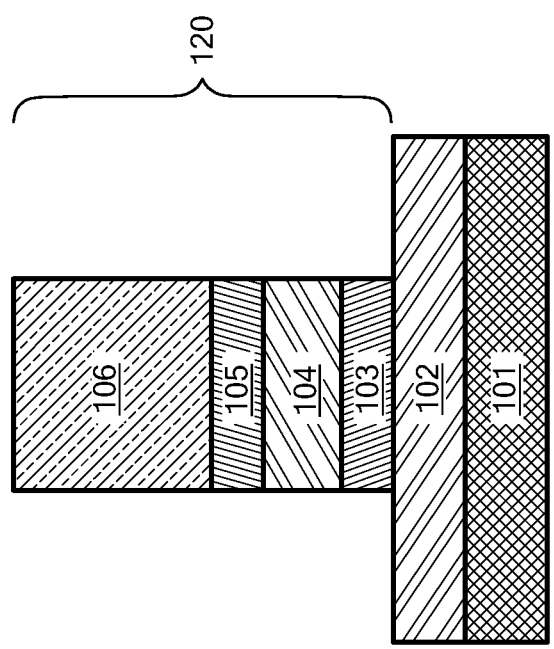

Referring to FIG. 1E, the magnetoresistance stack is etched. For example, the exposed portions of the magnetoresistance stack 100 are etched using an ion beam etching process. In one particular example, not all of the layers 102, 103, 104 and 105 are etched. For example, the layer 102 is not etched, but the layers 103, 104, 105 are etched to form an intermediate structure 120 with the hard mask 106.

Referring to FIG. 1F, an etch barrier is deposited on the intermediate structure 120. For example, an etch barrier 117 is deposited on the remaining magnetoresistance stack 100 completely covering the side of the intermediate structure 120 (i.e., remaining portions of the magnetoresistance stack 100). The etch barrier 117 includes nonconductive material. In some examples, the etch barrier 117 includes silicon nitride or silicon dioxide.

Figure 1H:
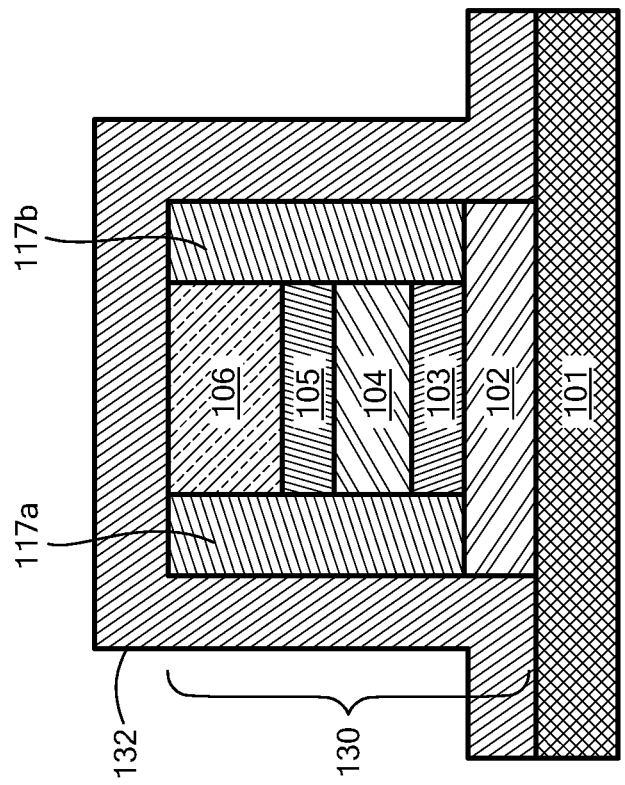
Figure 1G:
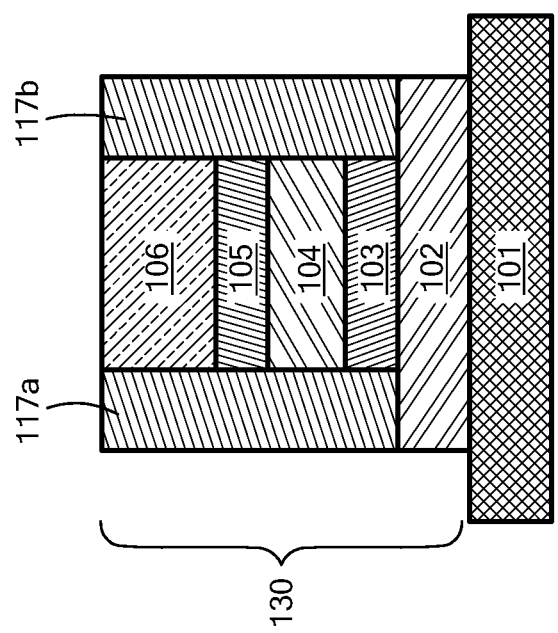

Referring to FIG. 1G, the etch barrier and the magnetoresistance stack is etched to form a pillar structure. For example, portions of the etch barrier 117 and the layer 102 are etched using ion beam etching to form a pillar structure 130 with the remaining etch barrier forming nonconductive sidewalls 117a, 117b of the pillar structure 130 and disposed on the layer 102. The sidewalls 117a, 117b protect the layer 103 (e.g., tunneling barrier) from being shunted, for example, by any conductive material that may be re-deposited during etch of layer 102 onto sidewall of 103.

Referring to FIG. 1H, an endcap is deposited on the pillar structure. For example, an end cap 132 is disposed on the pillar structure 130 to protect the pillar structure 130. In one example, the capping layer is silicon nitride.

Figure 2:
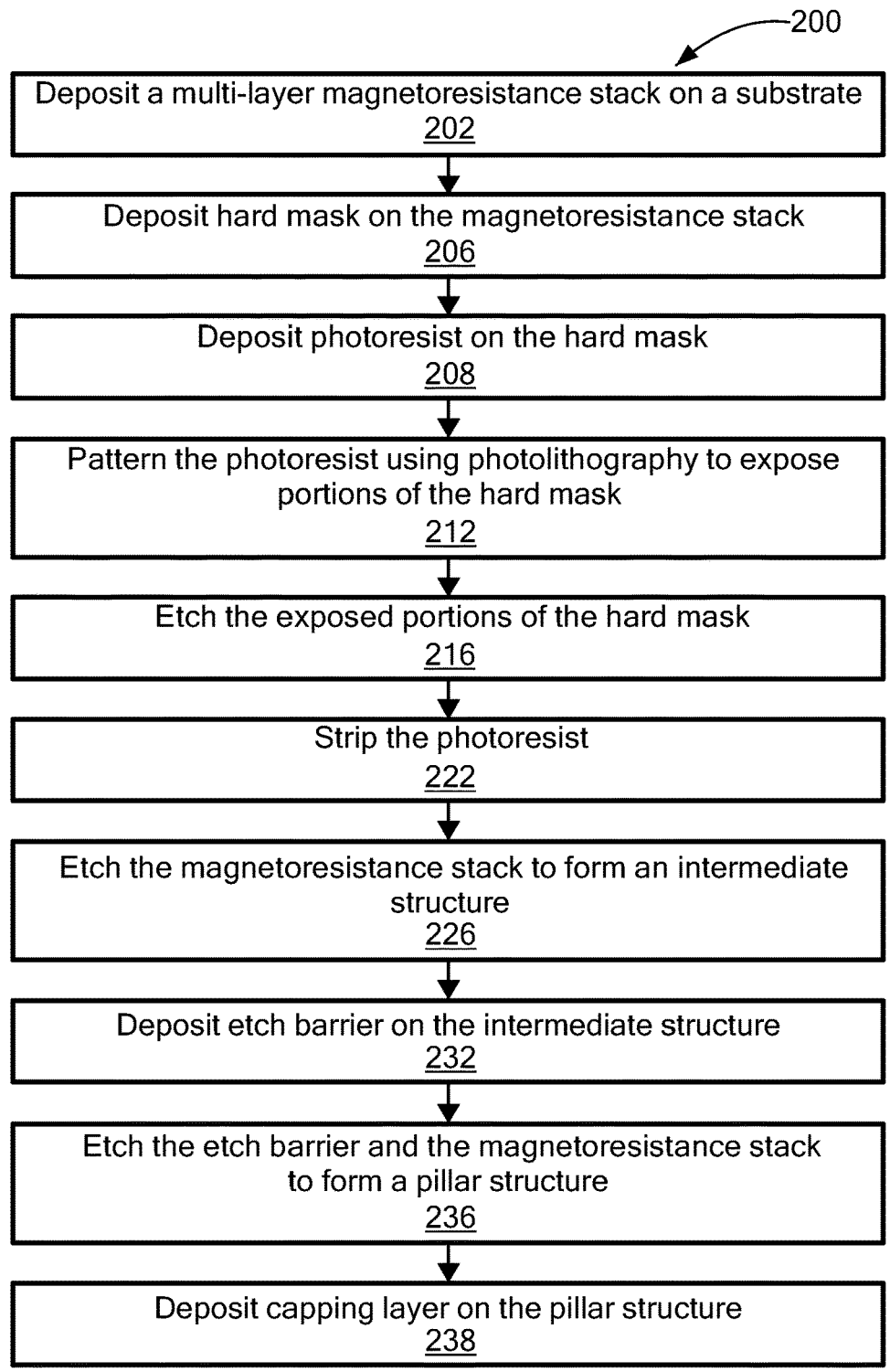
FIG. 2 is a flowchart of an example of a process to pattern the magnetoresistance stack.

Referring to FIG. 2, an example of a process to pattern a magnetoresistance stack is a process 200. In one example, process 200 is performed under vacuum.

Process 200 deposits a multilayer magnetoresistive stack on a substrate (202) and deposits a hard mask on the multilayer magnetoresistive stack (206), for example as depicted in FIG. 1A.

Process 200 deposits photoresist on the hard mask (208) and patterns the photoresist using photolithography to expose portions of the hard mask (212), for example, as depicted in FIG. 1B.

Process 200 etches the exposed portions of the hardmask (216), for example, as depicted in FIG. 1C. Process 200 strips the photoresist (222), for example, as depicted in FIG. 1D.

Process 200 etches the exposed portions of the magnetoresistive stack hardmask to form an intermediate structure (226), for example, as depicted in FIG. 1E. Process 200 deposits an etch barrier on the intermediate structure (232), for example, as depicted in FIG. 1F.

Process 200 etches the etch barrier and the magnetoresistive stack to form a pillar structure (236), for example, as depicted in FIG. 1G. Process 200 deposits a capping layer on the pillar structure (238), for example, as depicted in FIG. 1H.

The processes described herein are not limited to the specific examples described. For example, the process 200 is not limited to the specific processing order of FIG. 2 respectively. Rather, any of the processing blocks of FIG. 2 may be re-ordered, combined or removed, performed in parallel or in serial, as necessary, to achieve the results set forth above. In another example, processing blocks 232 and 236 to form the sidewalls 117a, 117b may be repeated for each tunneling barrier 103 in a magnetoresistive stack.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
    depositing on a substrate a magnetoresistance stack comprising a plurality of layers comprising a first set of one or more magnetoresistance layers and a second set of one or more magnetoresistance layers;
    depositing a hard mask on the magnetoresistance stack;
    depositing photoresist on the hard mask;
    patterning the photoresist using photolithography to expose portions of the hard mask;
    etching the exposed portions of the hard mask to expose a portion of the magnetoresistance stack;
    stripping the photoresist;
    etching the first set of one or more magnetoresistance layers of the exposed portion of the magnetoresistance stack to form an intermediate structure comprising the hard mask and the first set of one or more magnetoresistance layers;
    depositing an etch barrier on the intermediate structure and the second set of one or more magnetoresistance layers;
    etching the etch barrier and a portion of the second set of one or more magnetoresistance layers to the substrate to form a pillar structure comprising side walls comprising the etch barrier, the side walls disposed on the second set of one or more magnetoresistance layers; and
    depositing an endcap comprising silicon nitride on the pillar structure.

2. The method of claim 1, wherein depositing on the substrate the magnetoresistance stack comprises depositing one of a tunneling magnetoresistance (TMR) stack or a magnetic tunnel junction (MTJ) stack.

3. The method of claim 1, wherein depositing the magnetoresistance stack on the substrate comprises depositing the magnetoresistance stack comprising a layer of magnesium oxide.

4. The method of claim 1, wherein depositing the magnetoresistance stack on the substrate comprises depositing the magnetoresistance stack comprising a layer of silicon nitride.

5. The method of claim 1, wherein depositing the magnetoresistance stack on the substrate comprises depositing the magnetoresistance stack on the substrate, the substrate comprising one of silicon dioxide or silicon nitride.

6. The method of claim 1, wherein depositing a hard mask on the magnetoresistance stack comprises depositing the hard mask comprising silicon dioxide.

7. The method of claim 1, wherein partially etching the first set of one or more magnetoresistance layers of the exposed portion of the magnetoresistance stack comprises partially etching using an ion beam etching process.

8. The method of claim 1, wherein depositing an etch barrier comprises depositing the etch barrier comprising silicon nitride.

9. The method of claim 1, wherein etching the portion of the etch barrier and the portion of the second set of one or more magnetoresistance layers comprises etching using an ion beam etching process.

10. The method of claim 1, wherein depositing on the substrate a magnetoresistance stack having a plurality of layers comprising the first set of one or more magnetoresistance layers and the second set of one or more magnetoresistance layers comprises depositing on the substrate the magnetoresistance stack having the plurality of layers comprising:
- the first set of one or more magnetoresistance layers comprising:
  - one or more active elements;
  - a tunneling barrier layer; and
- the second set of one or more magnetoresistance layers comprising an active element.

11. A magnetoresistance structure comprising:
- a magnetoresistance stack comprising a plurality of layers comprising a first set of one or more magnetoresistance layers and a second set of one or more magnetoresistance layers;
- side walls attached to the sides of the first set of one or more magnetoresistance layers and disposed on the second set of one or more magnetoresistance layers; and
- an endcap comprising silicon nitride on the magnetoresistance stack and the side walls.

12. The magnetoresistance structure of claim 11, wherein the magnetoresistance stack comprises one of a tunneling magnetoresistance (TMR) stack or a magnetic tunnel junction (MTJ) stack.

13. The magnetoresistance structure of claim 11, wherein the magnetoresistance stack comprises a layer of magnesium oxide.

14. The magnetoresistance structure of claim 11, wherein the magnetoresistance stack comprises a layer of silicon nitride.

15. The magnetoresistance structure of claim 11, further comprising a substrate on which the magnetoresistance stack is disposed and wherein the substrate comprises one of silicon dioxide or silicon nitride.

16. The magnetoresistance structure of claim 11, wherein the side walls comprise silicon nitride.

17. The magnetoresistance structure of claim 11, wherein:
- the first set of one or more magnetoresistance layers comprises:
  - one or more active elements;
  - a tunneling barrier layer; and
- the second set of one or more magnetoresistance layers comprising an active element.

18. A magnetoresistance structure comprising:
- a magnetoresistance stack comprising a plurality of layers comprising a first set of one or more magnetoresistance layers and a second set of one or more magnetoresistance layers, wherein the magnetoresistance stack comprises a layer of silicon nitride; and
- side walls attached to the sides of the first set of one or more magnetoresistance layers and disposed on the second set of one or more magnetoresistance layers.

19. The magnetoresistance structure of claim 18, wherein the magnetoresistance stack comprises one of a tunneling magnetoresistance (TMR) stack or a magnetic tunnel junction (MTJ) stack.

20. The magnetoresistance structure of claim 18, further comprising an endcap on the magnetoresistance stack and the side walls.

21. The magnetoresistance structure of claim 20, wherein the endcap comprises silicon nitride.

22. The magnetoresistance structure of claim 18, wherein the magnetoresistance stack comprises a layer of magnesium oxide.

23. The magnetoresistance structure of claim 18, further comprising a substrate on which the magnetoresistance stack is disposed and wherein the substrate comprises one of silicon dioxide or silicon nitride.

24. The magnetoresistance structure of claim 18, wherein the side walls comprise silicon nitride.

25. The magnetoresistance structure of claim 18, wherein:
- the first set of one or more magnetoresistance layers comprises:
  - one or more active elements;
  - a tunneling barrier layer; and
- the second set of one or more magnetoresistance layers comprising an active element.

\* \* \* \* \*

UNITED STATES PATENT AND TRADEMARK OFFICE
CERTIFICATE OF CORRECTION

PATENT NO.         : 10,050,193 B1
APPLICATION NO.    : 15/613313
DATED              : August 14, 2018
INVENTOR(S)        : Maxim Klebanov et al.

Page 1 of 1

It is certified that error appears in the above-identified patent and that said Letters Patent is hereby corrected as shown below:

Item (71) delete "Worcester, MA" and replace with --Manchester, NH--.

Column 1, Line 45 delete "magnetoresi stance" and replace with --magnetoresistance--.

Signed and Sealed this
Fourth Day of December, 2018

Andrei Iancu
*Director of the United States Patent and Trademark Office*